Feb. 24, 1953 L. L. KOROS 2,629,858

TRANSISTOR AMPLITUDE MODULATOR

Filed Dec. 29, 1950

INVENTOR
Leslie L. Koros
BY H. L. Newton
ATTORNEY

Patented Feb. 24, 1953

2,629,858

UNITED STATES PATENT OFFICE 2,629,858

TRANSISTOR AMPLITUDE MODULATOR

Leslie L. Koros, Camden, N. J., assignor to Radio Corporation of America, a corporation of Delaware Application December 29, 1950, Serial No. 203,397

5 Claims. (Cl. 332—31)

This invention relates generally to amplitude modulation systems, and particularly relates to a semi-conductor amplifier circuit arranged to modulate the amplitude of a carrier wave.

A semi-conductor amplifier circuit may be utilized for modulating the amplitude of a carrier wave. To this end, the carrier wave may be impressed between the emitter and base electrodes of a semi-conductor amplifier or transistor. The modulation signal may be impressed between the collector and base electrodes of the amplifier circuit. Accordingly, the amplitude of the carrier wave derived between the collector and base electrodes will be modulated in accordance with the modulation signal.

However, it has been found that in such an amplitude modulation system utilizing a transistor the amplitude modulated carrier wave derived from the output circuit is also phase modulated. This phase modulation represents distortion which is undesired. This phase distortion of the amplitude modulated output wave is caused by a leakage current between the input and output electrodes of the transistor, that is, essentially between the emitter and collector electrodes. Accordingly, a portion of the carrier wave which is the exciting energy leaks over into the output circuit and the phase of this leakage current may be different from the phase of the amplitude modulated output wave. The result is that the amplitude modulated output wave has a certain amount of phase distortion.

It is believed that this phase distortion is caused by the internal impedance of the transistor. This internal impedance may cause the phase of the leakage current to be different from that of the amplitude modulated output wave.

It is accordingly the principal object of the present invention to provide an improved amplitude modulation system including a semi-conductor amplifier which will substantially eliminate undesired phase modulation of the output wave.

A further object of the invention is to provide a transistor modulator circuit arranged to modulate the amplitude of carrier wave wherein means are provided to compensate for the phase deviating effect of the leakage current which is inherently present in a transistor.

An amplitude modulation system in accordance with the present invention comprising a semi-conductor device such as a transistor. The device includes a semi-conducting body. A base electrode, an emitter electrode and a collector electrode are provided in contact with the body.

The carrier wave to be modulated is impressed between the emitter and the base. The modulation signal is applied between the collector and the base. A resonant output circuit is coupled between the collector and base and is tuned to the frequency of the impressed carrier wave and an amplified carrier wave amplitude modulated in accordance with the modulation signal is derived from the resonant output circuit.

The semi-conductor device inherently has a leakage current between emitter and collector which will produce an undesired phase modulation of the amplitude modulated carrier wave because the leakage current may be out of phase with the amplified wave which is delivered by the collector circuit. In accordance with the present invention a predetermined portion of the modulation signal is impressed on the emitter and base electrodes simultaneously with the carrier wave, which is to be amplified and amplitude modulated in the collector circuit. Consequently, the carrier wave energy impressed on the emitter of the semi-conductor device is also modulated to a predetermined extent and in a predetermined direction. In this manner the undesired phase modulation of the amplitude modulated output carrier wave is substantially eliminated.

Other amplitude modulation systems which will compensate for the undesired phase distortion of the amplitude modulated output wave inherent in the transistor have been disclosed and claimed in the copending application to L. L. Koros entitled "Semi-Conductor Amplitude Modulation Systems" and filed concurrently herewith.

The novel features that are considered characteristic of this invention are set forth with particularly in the appended claims. The invention itself, however, both as to its organization and method of operation, as well as additional objects and advantages thereof, will best be understood from the following description when read in connection with the accompanying drawing, in which:

Figure 1:
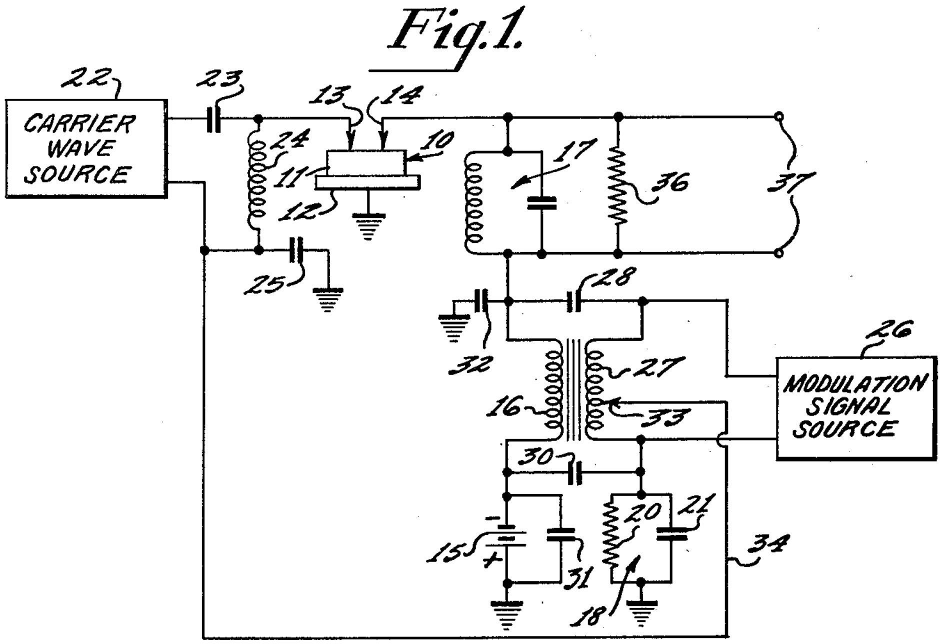
Figure 1 is a circuit diagram of an amplitude modulation system embodying the present invention.

Referring now to Figure 1, there is illustrated an amplitude modulation system comprising a semi-conductor device 10. The device 10 includes a semi-conducting body 11 which may, for example, consist of silicon or preferably of germanium. The semi-conducting body 11 is prepared in a conventional manner well known in the art. A base electrode 12, an emitter electrode 13 and a collector electrode 14 are in contact with body 11. Base electrode 12 is in low-resistance contact with the body 11 and may be a large-area electrode as indicated. Emitter electrode 13 and collector electrode 14 are in rectifying contact with the body 11; they may be point electrodes as indicated or they may be in line contact with body 11 or even in large-area contact provided they form rectifying contacts with the body.

Operating potentials are applied to the electrodes 12 to 14. As is well known a potential in reverse direction is applied between collector 14 and base 12. Furthermore, a potential in the forward direction is applied between emitter 13 and base 12. If semi-conducting body 11 is of the N type, the collector 14 should be negative and the emitter 13 positive with respect to the base 12. If the body 11 should be of the P type, the potentials must be reversed. It will be assumed for the following discussion that body 11 is of the N type.

Base electrode 12 may be grounded as shown and a source of potential such as battery 15 may have its positive terminal grounded while its negative terminal is connected through inductor 16 and parallel resonant circuit 17 to collector 14. The emitter electrode may also be biased by a suitable battery; however, it is feasible as shown in the drawing to provide instead a bias network 18 including resistor 20 and capacitor 21 connected in parallel. One terminal of bias network 18 is grounded as shown while its other terminal is connected to emitter 13 in a manner to be described hereinafter.

A source of a carrier wave is indicated at 22. The carrier wave is impressed on emitter 13 and may have any frequency provided it is higher than the highest frequency of the modulation signal. Furthermore, the carrier wave developed by source 22 may be a sinusoidal wave or a wave of any other suitable shape. One terminal of carrier wave source 22 is coupled to emitter electrode 13 by a coupling capacitor 23. A choke coil 24 is connected between emitter 13 and the other terminal of carrier wave source 22. The lower terminal of choke coil 24 is grounded through capacitor 25 which bypasses carrier frequency currents.

A source of a modulation signal is indicated at 26. The modulation signal may, for example, be an audio signal or a video signal or any other type of signal with which it is desired to modulate the carrier wave. Modulation signal source 26 is connected across inductor 27 forming the primary winding of a transformer, the secondary winding of which is formed by inductor 16. Transformer 16, 27 may be provided with a core as indicated provided the modulation signal is an audio signal. The upper terminals of transformer 16, 27 may be connected through coupling capacitor 28 while the lower terminals of the transformer may be coupled through capacitor 30. Capacitors 28, 30 are provided to correct the phase relation between the primary winding 27 and the secondary winding 16 so that the modulation signal is impressed on the secondary winding with the proper phase. Capacitors 28 and 30 must be connected between the windings when the transformer windings have a 1:1 turn ratio.

Battery 15 may be bypassed for modulation signal currents by capacitor 31. Capacitor 32 is provided between the junction point of secondary winding 16 and parallel resonant circuit 17, on the one hand, and ground, on the other hand, to bypass carrier frequency currents. Capacitor 21 of bias network 18 is arranged to bypass modulation signal currents.

Bias network 18 is connected to emitter electrode 13 through the lower portion of primary winding 27, variable tap 33 on conductor 37, lead 34 and choke coil 24.

Parallel resonant circuit 17 is preferably tuned to the frequency of the input carrier wave, and an output load impedance element such as resistor 36 is connected across parallel resonant circuit 17. Load resistor 36 may represent a utilization circuit such as the input circuit of a following amplifier stage. The output signal may be obtained from output terminals 37, in which case resistor 36 may be omitted or its resistance properly increased.

Disregarding for the present the connection through lead 34 between modulation signal source 26 and emitter electrode 13, the circuit of Figure 1 operates in a conventional manner. The carrier wave developed by source 22 is effectively impressed between emitter 13 and base 12. Accordingly, an amplified version of the carrier wave appears at the output terminals 37. It is well known that emitter 13 and base 12 operate as a peak rectifier of the impressed carrier wave. The rectified direct current flows through choke coil 24, lead 34, tap 33, the lower portion of primary winding 27 and bias network 18 to ground, that is, to base 12. The rectified current eventually builds up a charge across capacitor 21 which biases the emitter electrode 13. The thus developed bias voltage preferably is of such a magnitude as to provide class C operation of the semi-conductor device 10.

The collector bias voltage supplied by battery 15 is modulated by the modulation signal source 26 in accordance with the modulation signal. Accordingly, the amplified output wave which may be obtained from output terminals 37 has its amplitude modulated in accordance with the modulation signal.

However, this amplitude modulated output wave also may have an undesired phase modulation. As explained hereinbefore, this phase modulation is due to a leakage current which is inherently present in the device 10 and which flows essentially between emitter 13 and collector 14. Since this leakage current may be out of phase with the amplitude modulated output wave, phase modulation is produced. The effect of this leakage current may be more readily understood by reference to the vector diagram of Figure 2.

Figure 2:
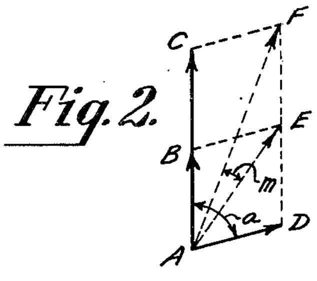
Figures 2 and 3 are vector diagrams which will be referred to in explaining the operation of the circuit of Figure 1.

The voltage vector AB in Figure 2 represents the unmodulated output carrier wave which is developed at load impedance element 36. The voltage vector BC is the vector sum of the rotating side bands which are produced by the amplitude modulation during peak modulation of the carrier wave. Consequently vector AB equals vector BC for 100 per cent modulation. The vector AD represents the leakage voltage which forms an angle $a$ with the output vector AC. The vector sum AE represents the output carrier wave voltage if no modulation is present. If the leakage vector AD is added to the modulated carrier wave vector AC, the peak envelope voltage is shown by the voltage vector AF. It will be seen that an angle $m$ is formed between the vector AE and AF. This angle $m$ is a function of the modulation signal. Accordingly, the output carrier wave, which is produced by a combination of the vectors AD and AC, has a phase modulation, the angle $m$ of which varies during the modulation cycle.

In accordance with the present invention the leakage voltage vector AD is also modulated with the modulation signal thereby to eliminate the effect of the phase distortion. This effect has been illustrated in Figure 3 where the vectors AB, BC, AD and AE represent the same voltages as in Figure 2. If the leakage voltage vector AD is modulated in the same ratio as the output wave, it becomes AD'. Consequently, the vector sum AD and AB and the vector sum AD' and AC form a resulting vector AE or AF' which form a straight line so that the angle $m$ becomes zero. Regardless of the modulation level of the carrier wave, the resulting vector AE or AF' will be disposed in a straight line so that no phase modulation is present.

In accordance with the present invention, this is effected by impressing a portion of the modulation signal through adjustable tap 33, lead 34, and choke coil 24 on emitter electrode 13. Consequently both the carrier wave impressed on device 10 and the amplified carrier wave developed in resonant circuit 17 are modulated simultaneously by the modulation signal.

Figure 4:
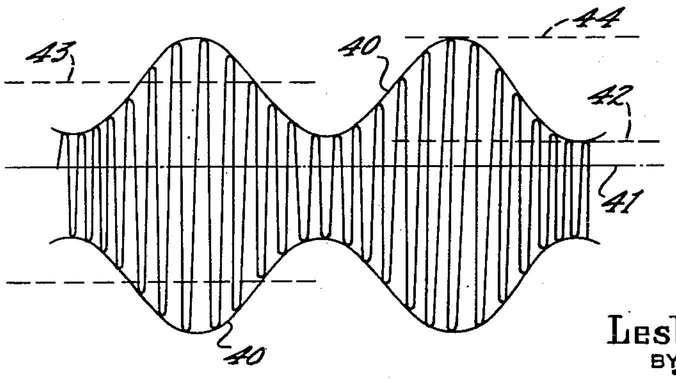
Figure 4 is a graph illustrating the amplitude modulated exciter carrier wave as applied to the emitter in the circuit of Figure 1.

The procedure for determining the percentage of the modulation with which the impressed input carrier wave is to be modulated will be explained in connection with Figure 4. Figure 4 illustrates schematically the exciter carrier wave which is applied to the emitter and base electrodes from the source 22. This wave will be amplified and amplitude modulated in accordance with the modulation signal and the output wave will be finally delivered to load resistor 36. The envelope of the carrier wave premodulated according to this invention is indicated at 40. The carrier wave below horizontal line 41 represents the unloaded portion of the exciter voltage which exhibits a higher amplitude than the upper loaded portion of the wave because the carrier wave suffers a voltage drop due to the internal resistance of source 22 and of device 10.

The emitter bias voltage is indicated by a dotted line 42. Dotted line 43 indicates the peaks of the unmodulated exciter carrier wave, that is, in the absence of the additional modulation signal in the emitter circuit. Dotted line 44 indicates the modulation peaks of the exciter voltage. The emitter bias voltage 42 effectively makes inactive the unmodulated part of the impressed carrier wave which appears below line 42. The applied carrier wave preferably is modulated up to the emitter bias shown at 42. The acting or active part of the carrier wave is the portion above the emitter bias line 42. Preferably the active portion of the carrier wave is modulated close to 100 per cent.

Figure 3:
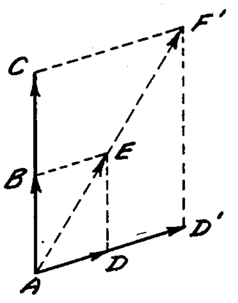

The modulation voltage applied to the emitter must, of course, be in phase with the modulation voltage applied to the collector 14. To this end, the leakage between tap 33 and the lower terminal of inductor 27, and the entire inductor 27 should be as small as possible. Under these conditions the component of the leakage current is modulated in the same ratio as the applied carrier wave as illustrated in Figure 3 at any modulating frequency.

By way of example in a circuit in accordance with the present invention the voltage of the applied carrier wave excitation between the emitter and ground is 2.25 volts R. M. S. The modulation signal applied to the collector 14 is 2.45 volts R. M. S. in order to produce 100 per cent amplitude modulation without phase modulation provided the 2.25 volts R. M. S. excitation is also modulated as described here. The emitter bias voltage is 2.6 volts D. C. corresponding to dotted line 42 in Figure 4. Under these conditions the modulation signal applied to emitter 13 has a voltage of .43 volt R. M. S. If the impressed carrier wave is unmodulated, the acting peaks of the wave has a voltage of $2.25\sqrt{2}-2.6=.58$ volt R. M. S. corresponding to the distance between dotted lines 43 and 42 in Figure 4. The theoretical R. M. S. voltage required to modulate the carrier input wave to prevent phase modulation was found to be $.58/\sqrt{2}=.41$ volt R. M. S. which is in close agreement with the experimentally observed value of .43 volt R. M. S.

There has thus been disclosed an amplitude modulation system including a transistor which will substantially eliminate the undesired phase distortion due to the leakage current inherent in a transistor. This is effected by applying a portion of the modulation signal to the input electrodes of the device.

It has previously been proposed to modulate the exciting power of plate modulated electron tubes. However, in that case, the additional grid modulation was proposed to produce a more nearly straight line relation between the modulating input radio frequency voltages and the resulting output radio frequency tank voltages. Furthermore, the amount of the additional grid modulation utilized in a plate modulated electron tube is different from the amount of modulation applied to the input electrodes of a transistor in accordance with the present invention. The input electrodes of the transistor are modulated by the modulation signal only for the purpose of eliminating phase distortion of the amplitude modulated wave, which is not the purpose of the grid modulation referred to.

What is claimed is:

1. An amplitude modulation system comprising a semi-conductor device including a semi-conducting body, a base electrode, an emitter electrode and a collector electrode in contact with said body, means applying operating potentials to said electrodes, a carrier wave source coupled between said emitter and base electrodes for impressing said carrier wave thereon, a modulation signal source coupled between said collector and base electrodes for impressing said modulation signal thereon, a resonant output circuit coupled between said collector and base electrodes and tuned to the frequency of said carrier wave for deriving therefrom an amplified carrier wave amplitude modulated in accordance with said modulation signal, and a circuit connection between said signal source and said emitter and base electrodes for impressing a predetermined portion of said modulation signal on said emitter and base electrodes simultaneously with said carrier wave, thereby to modulate said carrier wave impressed on said device to a predetermined extent and in a predetermined direction as provided by said modulation signal.

2. An amplitude modulation system comprising a semi-conductor device including a semi-conducting body, a base electrode, an emitter electrode and a collector electrode in contact with said body, means applying a potential in the reverse direction between said collector and base electrodes and a potential in the forward direction between said emitter and base electrodes, a carrier wave source coupled between said emitter and base electrodes for impressing said carrier wave thereon, said impressed carrier wave having an active portion exceeding said potential in the forward direction, a modulation signal source coupled between said collector and base electrodes for impressing said modulation signal thereon, a resonant output circuit coupled between said collector and base electrodes and tuned to the frequency of said carrier wave for deriving therefrom an amplified carrier wave amplitude modulated in accordance with said modulation signal, and a circuit connection between said signal source and said emitter and base electrodes for impressing such a portion of said modulation signal on said emitter and base electrodes simultaneously with said carrier wave as to modulate said active portion of said carrier wave impressed on said device substantially to the same extent as said amplified carrier wave is modulated by said modulation signal.

3. An amplitude modulation system comprising a semi-conductor device including a semi-conducting body, a base electrode, an emitter electrode and a collector electrode in contact with said body, means applying a potential in the reverse direction between said collector and base electrodes, and a potential in the forward direction between said emitter and base electrodes, a carrier wave source coupled between said emitter and base electrodes for impressing said carrier wave thereon, a modulation signal source coupled between said collector and base electrodes for impressing said modulation signal thereon, a resonant output circuit coupled between said collector and base electrodes and tuned to the frequency of said carrier wave for deriving therefrom an amplified carrier wave amplitude modulated in accordance with said modulation signal, and a circuit connection between said signal source and said emitter and base electrodes for impressing such a portion of said modulation signal on said emitter and base electrodes simultaneously with said carrier wave as to modulate substantially completely the portion of said carrier wave impressed on said device which exceeds said potential in the forward direction.

4. An amplitude modulation system comprising a semi-conductor device including a semi-conducting body, a base electrode, an emitter electrode and a collector electrode in contact with said body, means connecting said base electrode to ground, a carrier wave source, a modulation signal source, a parallel resonant output circuit tuned to the frequency of said carrier wave, a transformer having a primary winding connected across said modulation signal source and a secondary winding, a source of voltage, said output circuit, said secondary winding and said source of voltage being connected serially between said collector electrode and ground, said source of voltage being so poled as to apply a voltage in the reverse direction between said collector and base electrodes, said carrier wave source being coupled to said emitter electrode, an inductor arranged as a carrier wave choke and connected across said carrier wave source and between said emitter electrode and an intermediate point of said primary winding, and means connected between said emitter electrodes and ground applying a bias voltage to said emitter electrode, whereby a predetermined portion of said modulation signal is applied to said emitter electrode.

5. An amplitude modulation system comprising a semi-conductor device including a semi-conducting body, a base electrode, an emitter electrode and a collector electrode in contact with said body, means connecting said base electrode to ground, a carrier wave source, a modulation signal source, a parallel resonant output circuit tuned to the frequency of said carrier wave, a transformer having a primary winding connected across said modulation signal source and a secondary winding, a direct current source of operating voltage connected serially with said output circuit and said secondary winding between said collector electrode and ground, said source of voltage being so poled as to apply a voltage in the reverse direction between said collector and base electrodes, said carrier wave source being coupled to said emitter electrode, an inductor arranged as a carrier wave choke and connected across said carrier wave source and between said emitter electrode and an intermediate point of said primary winding, and a resistor and a capacitor connected in parallel between one terminal of said primary winding and ground to develop a bias voltage for said emitter electrode, whereby a predetermined portion of said modulation signal is applied to said emitter electrode.

LESLIE L. KOROS.

REFERENCES CITED

The following references are of record in the file of this patent:

UNITED STATES PATENTS

| Number | Name | Date |
|---|---|---|
| 2,436,066 | Favre | Feb. 17, 1948 |
| 2,486,776 | Barney | Nov. 1, 1949 |